United States Patent
Wu et al.

(10) Patent No.: US 10,344,571 B2
(45) Date of Patent: Jul. 9, 2019

(54) OPTIMIZATION OF EXCITATION SOURCE PLACEMENT FOR DOWNHOLE RANGING AND TELEMETRY OPERATIONS

(71) Applicant: Halliburton Energy Services, Inc, Houston, TX (US)

(72) Inventors: Hsu-Hsiang Wu, Sugar Land, TX (US); Burkay Donderici, Houston, TX (US); Yijing Fan, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 165 days.

(21) Appl. No.: 15/129,097

(22) PCT Filed: Aug. 19, 2015

(86) PCT No.: PCT/US2015/045828
§ 371 (c)(1),
(2) Date: Sep. 26, 2016

(87) PCT Pub. No.: WO2017/030575
PCT Pub. Date: Feb. 23, 2017

(65) Prior Publication Data
US 2017/0191349 A1    Jul. 6, 2017

(51) Int. Cl.
*E21B 41/00* (2006.01)
*E21B 44/00* (2006.01)
*E21B 7/04* (2006.01)
*E21B 47/12* (2012.01)
*E21B 49/00* (2006.01)
*G01V 3/20* (2006.01)
(Continued)

(52) U.S. Cl.
CPC ............ *E21B 41/0092* (2013.01); *E21B 7/04* (2013.01); *E21B 44/00* (2013.01); *E21B 47/02216* (2013.01); *E21B 47/122* (2013.01); *E21B 49/00* (2013.01); *G01V 3/20* (2013.01); *G06F 17/5009* (2013.01)

(58) Field of Classification Search
USPC ................. 703/2, 6; 166/302, 50; 340/854.4
See application file for complete search history.

(56) References Cited

U.S. PATENT DOCUMENTS

| 5,543,715 A | 8/1996 | Singer et al. |
| 8,113,272 B2 * | 2/2012 | Vinegar ................. E21B 43/24 166/50 |

(Continued)

FOREIGN PATENT DOCUMENTS

| EP | 0793119 A2 | 9/1997 |
| EP | 2101198 A1 | 9/2009 |

OTHER PUBLICATIONS

International Search Report and the Written Opinion of the International Search Authority, or the Declaration, dated May 31, 2016, PCT/US2015/045828, 15 pages, ISA/KR.

*Primary Examiner* — Thai Q Phan
(74) *Attorney, Agent, or Firm* — Haynes and Boone, LLP

(57) ABSTRACT

Methods to accurately plan and optimize clamped source excitation in ranging or telemetry operations approximate a well having a complex pipe structure as a simple solid pipe ("effective model") with an effective pipe cross-section and resistance. The simple solid pipe is then treated as a thin wire and analyzed using a FAST Code.

37 Claims, 11 Drawing Sheets

(51) Int. Cl.
*G06F 17/50* (2006.01)
*E21B 47/022* (2012.01)

(56) References Cited

U.S. PATENT DOCUMENTS

| | | | | |
|---|---|---|---|---|
| 8,172,335 | B2* | 5/2012 | Burns | C10G 21/22 |
| | | | | 299/2 |
| 8,662,175 | B2* | 3/2014 | Karanikas | E21B 36/04 |
| | | | | 166/272.3 |
| 9,181,797 | B2* | 11/2015 | Zientarski | H04B 13/02 |
| 2009/0120646 | A1* | 5/2009 | Kim | E21B 36/04 |
| | | | | 166/302 |
| 2009/0260823 | A1* | 10/2009 | Prince-Wright | C10G 21/22 |
| | | | | 166/302 |
| 2010/0134113 | A1 | 6/2010 | Depavia et al. | |
| 2011/0198078 | A1 | 8/2011 | Harrigan et al. | |
| 2013/0063276 | A1* | 3/2013 | Zientarski | H04B 13/02 |
| | | | | 340/854.4 |
| 2016/0273343 | A1* | 9/2016 | Donderici | G01V 3/26 |

* cited by examiner

Illustration of FDTD discretization for complex tool

Approximate the original tool with a simple solid pipe

Illustration of Real-Time Calibration Schemes
for the Proposed Ranging Planner

OPTIMIZATION OF EXCITATION SOURCE PLACEMENT FOR DOWNHOLE RANGING AND TELEMETRY OPERATIONS

PRIORITY

The present application is a U.S. National Stage patent application of International Patent Application No. PCT/US2015/045828, filed on Aug. 19, 2015, the benefit of which is claimed and the disclosure of which is incorporated herein by reference in its entirety.

FIELD OF THE DISCLOSURE

Embodiments of present disclosure generally relate to well drilling and logging system design and, more particularly, to a method for optimizing the placement of an excitation source within a wellbore system.

BACKGROUND

In downhole ranging applications which use electromagnetic ("EM") signals traveling along a pipe, estimation of signal strength at different positions along the pipe is critical. The signal may vary due to different formation properties, different well casing size and configuration, etc., such that the sensors may not be able to accurately determine the location of the downhole source. Therefore, in well drilling and logging system design, it is desirable to have an estimation of system performance.

In EM telemetry system design, it is important to have an idea of the estimated signal level that can be received at the surface based on the tool and environmental parameters. Excitation energy provided from the excitation source can then be chosen from the estimation. Transmitter, receiver, and repeaters can also be designed and positioned based on the estimation. In magnetic ranging system design using a surface excitation source, it is important to make sure there is sufficient current flow along the target well necessary to generate enough signal for sensors in the drilling well to detect. Hence, an estimation of the current distribution along drilling tool is important for designers to predict the feasibility of the system and thereby select the input power for the excitation source.

DESCRIPTION OF ILLUSTRATIVE EMBODIMENTS

Figure 1:
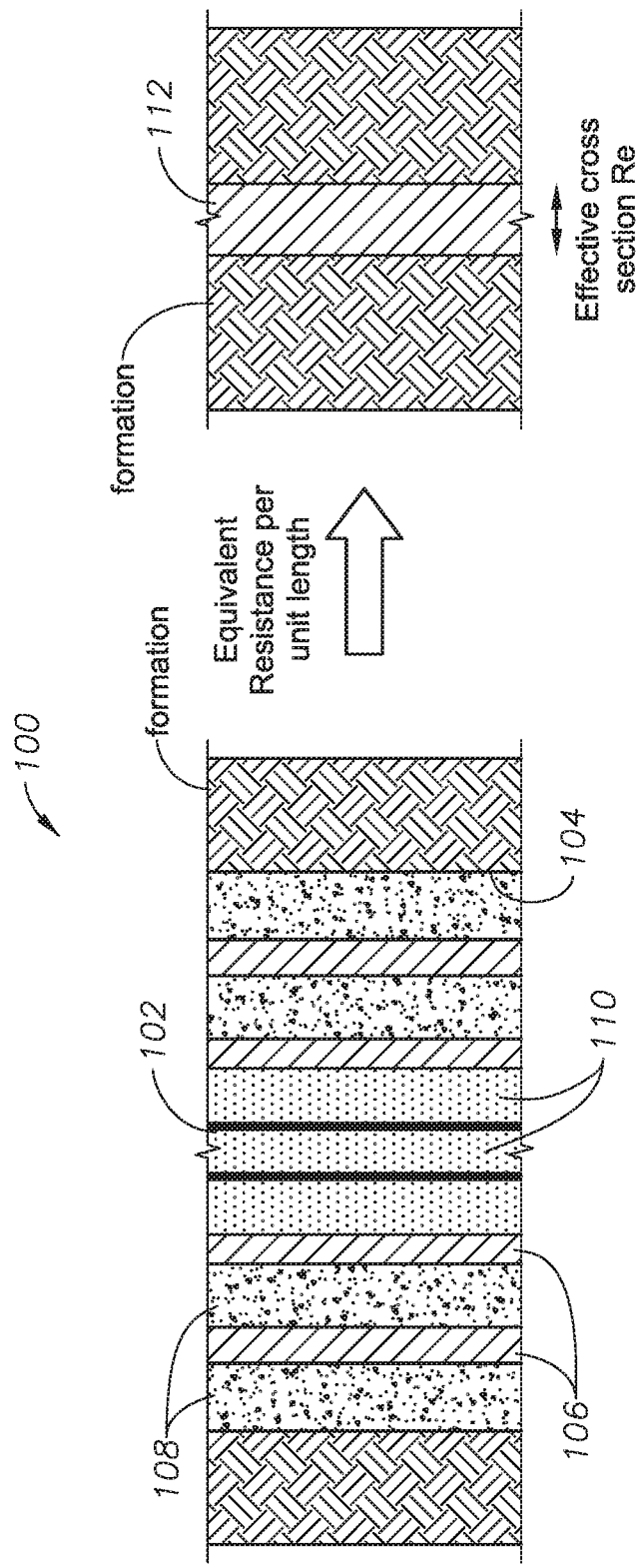
FIG. 1 illustrates the general principle of the present disclosure whereby a complex target well structure is approximated to a simple solid pipe having an effective cross section.

Illustrative embodiments and related methods of the present disclosure are described below as they might be employed in a method for optimizing the placement of an excitation source within a wellbore system. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

As described herein, the present disclosure is directed to method to accurately plan and optimize clamped source excitation in ranging or telemetry operations. "Clamped", as used herein, refers to an excitation source that is physically connected to the well. In general, the method approximates a well having a complex pipe structure as a simple solid pipe with an effective pipe cross-section and resistance. The simple solid pipe (i.e., the "effective model") is then treated as a thin wire and analyzed using a FAST Code. As used herein, a FAST Code refers to an algorithm that can simulate the interaction between a thin wire of given impedance per length with a layered or homogeneous medium. FAST Code can be based on integral equations, method of moments ("MOM"), finite difference, finite element or semi-analytic methods. Inputs to the code may comprise of impedance of the wire as a function of position on wire, isotropic or anisotropic resistivity, position of layers, position of the source, and position of the receivers and frequency of operation. Outputs of the code may be comprised of current as a function of position on the wire and fields in any layer of the formation. As a result, varying signal parameters are calculated and utilized to conduct downhole operations more effectively.

The method described herein may be used in many applications, such as, for example, magnetic ranging and EM telemetry, to help predict the current flow along the casing and signal levels at designated receivers. The illustrative methods can be also used in vertical or deviated wellbores. Thus, a ranging planner may be developed which provides the capability to: (1) accurately devise a ranging plan encompassing the types of excitation sources to utilize and at what depths; (2) update the ranging plan as the well is being drilled with new data; and (3) measure distance to target well near the end of the well by using a calibrated absolute signal. Accordingly, the illustrative methods described herein provide fast modeling capability useful to predict the signal or current level in real time or pre-job applications for EM telemetry and magnetic ranging operations.

FIG. 1 illustrates the general principle of the present disclosure whereby a complex target well structure is approximated to a simple solid pipe (i.e., effective model) having an effective cross section. In an EM telemetry or magnetic ranging system, the borehole 104 and drilling tool 102 typically form a target well structure 100 having a complex profile along the radial direction. Along the target well structure are one or more excitation sources (e.g., transmitters) and receivers. Multiple tubulars or casings 106, cementing layers 108, and mud 110 also form part of target well structure 100. In order to accurately estimate current flow along the wellbore in a magnetic ranging application, or to predict the received signal level at the surface in an EM telemetry application, the drilling tool with all tool details (tube, mud, cement) is modeled, as discussed below.

The illustrative methods of the present disclosure approximate complex profile 10 as an effective model 112 having the same/equivalent resistance per unit length as target well structure 100. This equivalent resistance per unit length of effective model 112 is referred to herein as the "effective resistance per unit length." An important factor effecting the current flow and EM field distribution on/around the drilling string is the resistance per unit length of the target well structure (i.e., complex profile 10). Using the effective resistance per unit length for complex profile 10, methods of the present disclosure generate effective model 112 which provides similar current and field distributions to that of the complex profile of target well structure 10. Effective model 112 can then be modeled as a thin wire and analyzed with a FAST Code that is applicable to both vertical and deviated wells.

Figure 2:
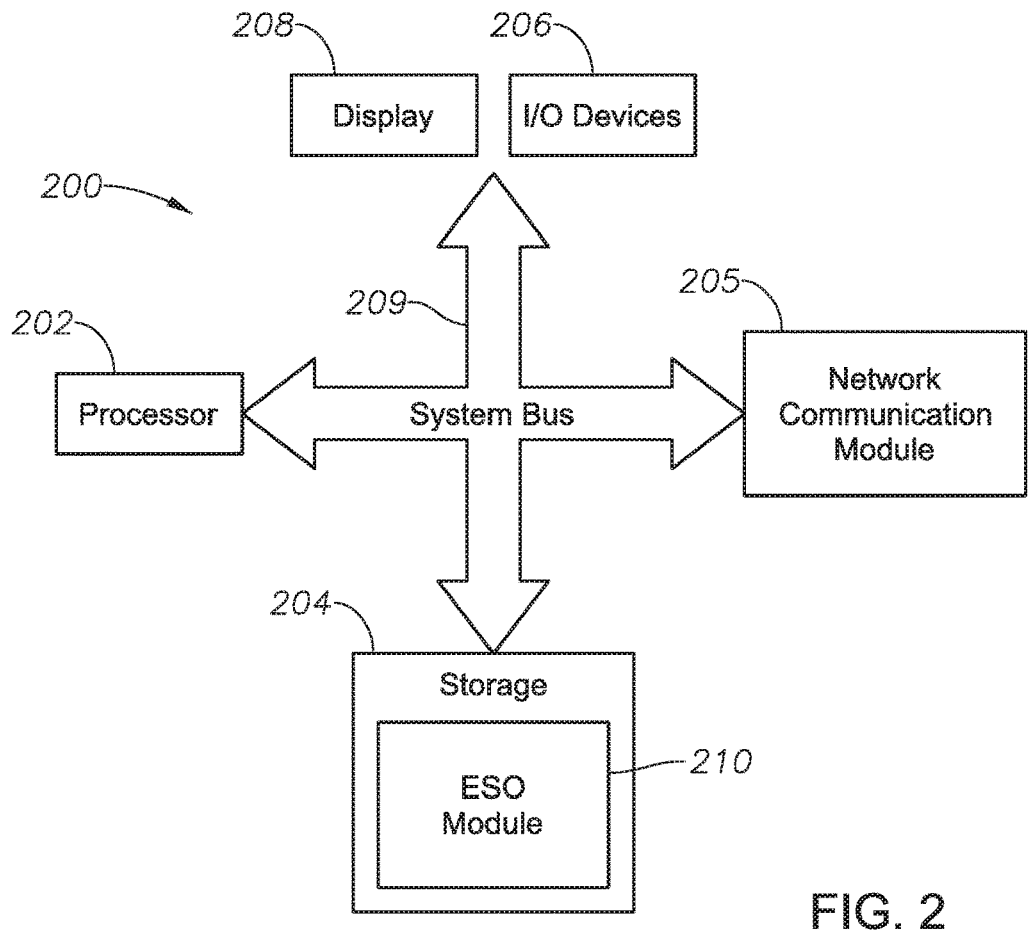
FIG. 2 is a block diagram of an excitation source optimization system which may be utilized to employ the illustrative methods of the present disclosure.

FIG. 2 is a block diagram of an excitation source optimization system which may be utilized to employ the illustrative methods of the present disclosure. Excitation source optimization ("ESO") system 200 includes at least one processor 202, a non-transitory, computer-readable storage 204 (also referred to herein as a "computer-program product"), transceiver/network communication module 205, optional I/O devices 206, and an optional display 208 (e.g., user interface), all interconnected via a system bus 209. In one embodiment, the network communication module 205 is a network interface card ("NIC") and communicates using the Ethernet protocol. In other embodiment, the network communication module 205 may be another type of communication interface such as a fiber optic interface and may communicate using a number of different communication protocols. Software instructions executable by the processor 202 for implementing software instructions stored within ESO module 210 in accordance with the illustrative methods described herein, may be stored in storage 204 or some other computer-readable medium.

Although not explicitly shown in FIG. 2, it will be recognized that ESO system 200 may be connected to one or more public (e.g., the Internet) and/or private networks via one or more appropriate network connections. It will also be recognized that the software instructions comprising ESO module 210 may also be loaded into storage 204 from a CD-ROM or other appropriate storage media via wired or wireless methods.

Moreover, those ordinarily skilled in the art will appreciate that embodiments of the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. Embodiments of the disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof in a computer system or other processing system.

Figure 3:
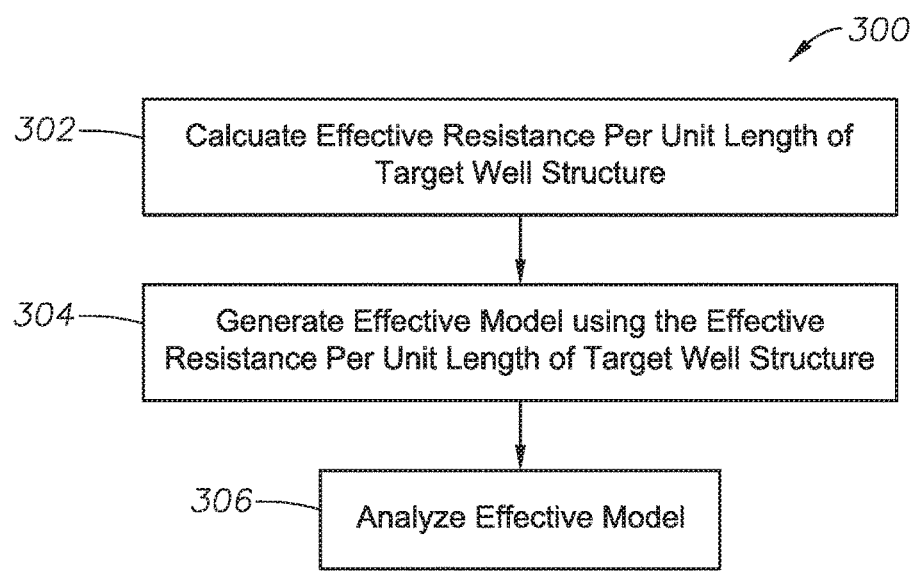
FIG. 3 is a flow chart for optimizing a downhole operation according to certain illustrative methods of the present disclosure.
Figure 4:
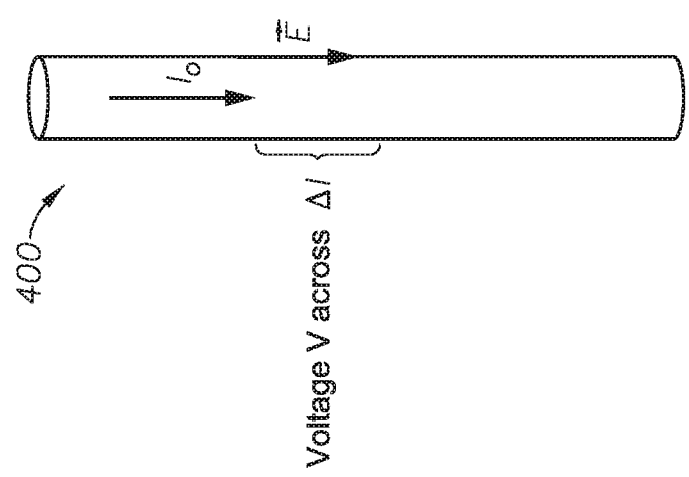
FIG. 4 shows a pipe useful to illustrate the calculation of the effective resistance per unit length, according to certain illustrative methods of the present disclosure.

FIG. 3 is a flow chart for optimizing a downhole operation according to certain illustrative methods of the present disclosure. With reference to FIGS. 1 and 3, at block 302, ESO system 200 calculates the effective resistance per unit length of target well structure 100. ESO system 200 may use a variety of methods to perform the calculation, such as, for example, a Finite Difference Time Domain ("FDTD") method. FIG. 4 shows a pipe 400 and is useful to illustrate the calculation of block 302. The target well structure 100 can be assumed as a cylindrical pipe structure 400 which is infinite in the axial direction. Pipe structure 400 has both XY-plane symmetry and azimuthal symmetry, and can be solved with a 1D method.

Figure 5:
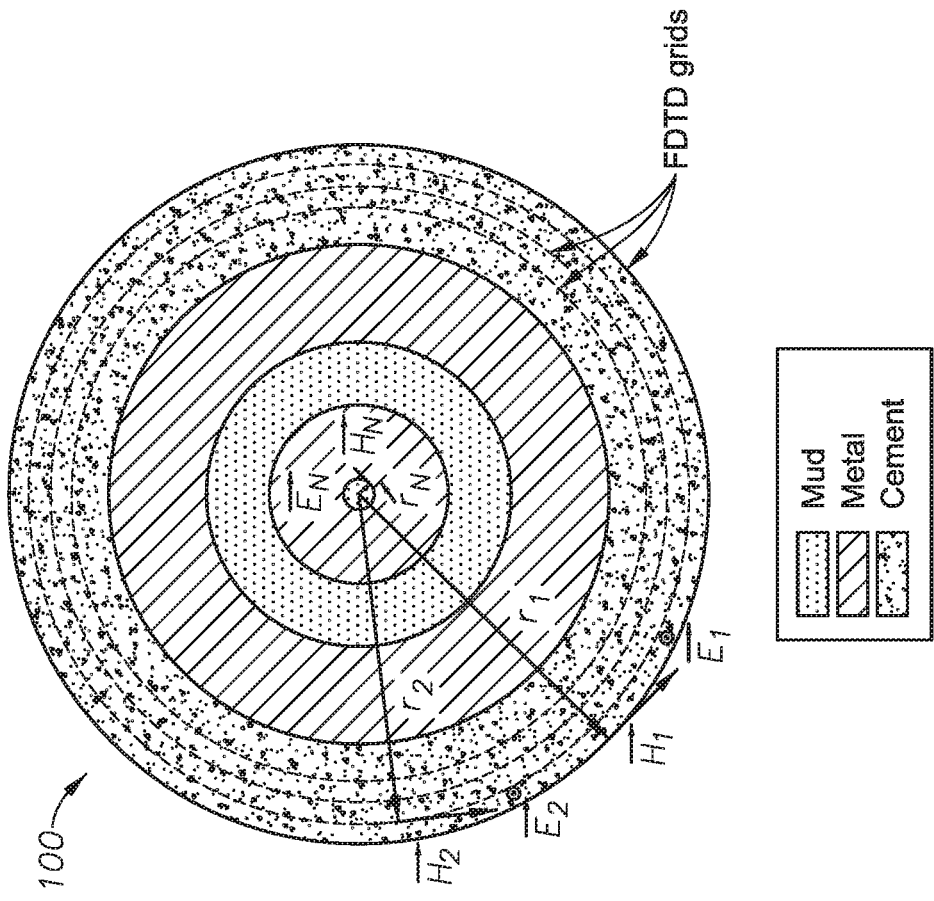
FIG. 5 illustrates the discretization for a complex target well structure using a sectional view, according to certain illustrative methods of the present disclosure.

In order to calculate the effective resistance per unit length at block 302, ESO system 200 discretizes pipe structure 400 into a model having concentric cylinders, and then calculates the magnetic H and electric E fields at each discretized cross-section. FIG. 5 illustrates the discretization for the complex target well structure 100 using a sectional view. With the E and H field values, the effective resistance per unit length of the complex target well structure can be obtained. To do so, a constant current with the value of $I_0$ may be assumed to be flowing through pipe 400, as shown in FIG. 4. Then, if the potential difference V along a portion of pipe 400 with a length $\Delta l$ is found, the resistance R for pipe section $\Delta l$ is:

$$R = \frac{V}{I_0}. \qquad \text{Eq. (1)}$$

Hence, the effective resistance per unit length, $R_{tool}$, of pipe 400 is:

$$R_{tool} = \frac{R}{\Delta l} = \frac{V}{I_0 \Delta l} = \frac{E_z}{I_0}, \qquad \text{Eq. (2)}$$

where $E_Z$ (FIG. 5) is the electric field intensity in the axial direction, and it is calculated using the FDTD method in this example. Accordingly, ESO system 200 calculates the effective resistance per unit length of the target well structure at block 302.

Figure 6:
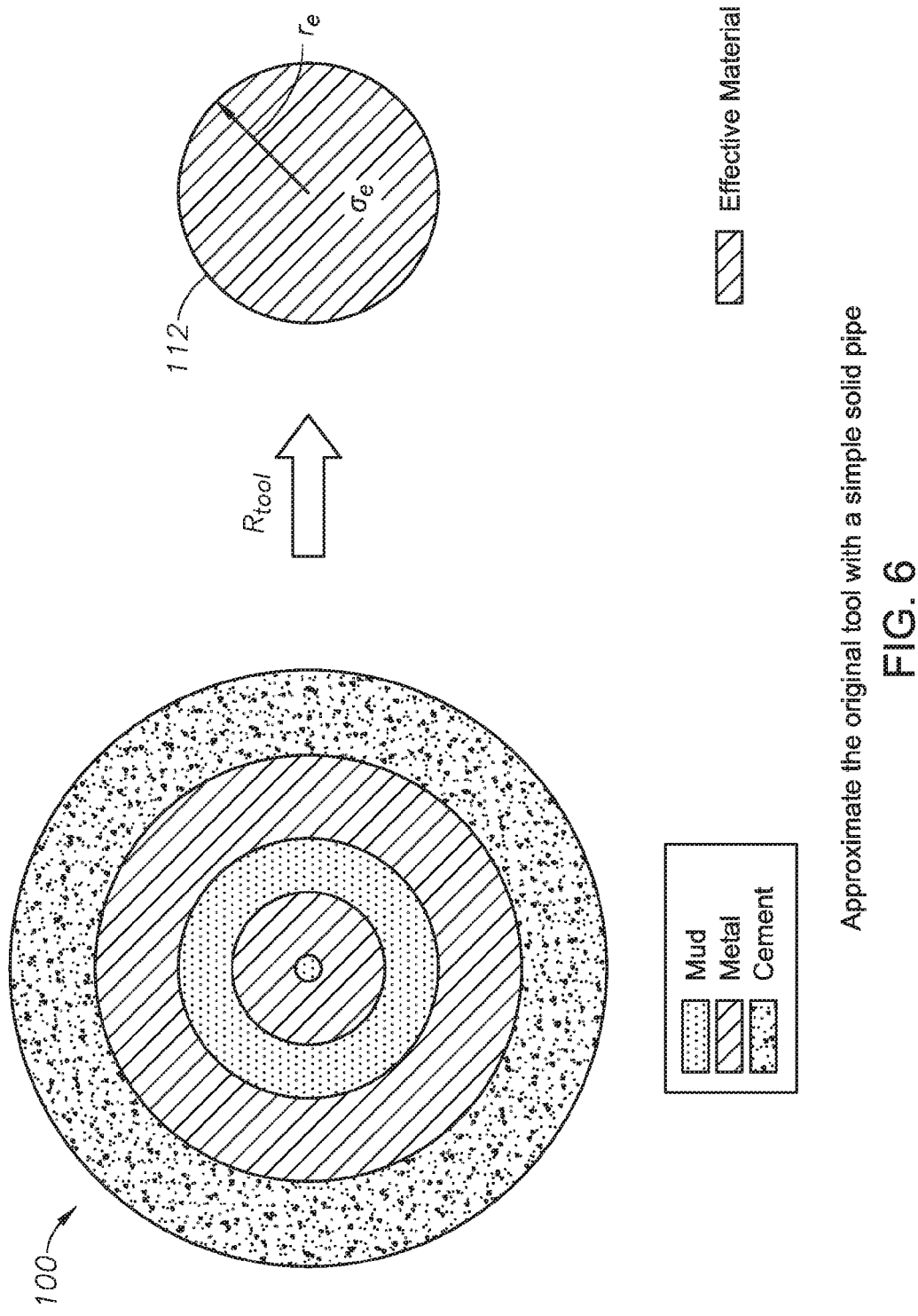
FIG. 6 illustrates the approximation of a complex target well structure with a an effective model, according to certain illustrative methods of the present disclosure.

At block 304, ESO system 200 then generates the effective model using the effective resistance per unit length. To achieve this, ESO system 200 must derive the effective cross section radius $r_e$ and effective conductivity $\sigma_e$ for the cross-sections to achieve the same effective resistance per unit length $R_{tool}$ for solid pipe effective model 112. To obtain the equivalent effective model with the same resistance per unit length $R_{tool}$ ($\Omega$/m), an arbitrary conductivity $\sigma_e$ for the solid pipe is selected, as shown in FIG. 6 which illustrates the approximation of target well structure 100 with a simple solid pipe (i.e., effective model 112).

Here, the resistivity $R_S$ of effective model 112 is:

$$R_s = \frac{1}{\sigma_e}(\Omega m), \qquad \text{Eq. (3)}$$

where ($\Omega$/m) is Ohms per meter. The cross section $A_e$ of the effective radius can be derived using:

$$A_e = \frac{R_s}{R_{tool}}(m^2) = \frac{1}{\sigma_e R_{tool}}. \qquad \text{Eq. (4)}$$

Thus, the effective radius $r_e$ of effective model 112 is:

$$r_e = \sqrt{\frac{A_e}{\pi}} = \sqrt{\frac{1}{\pi \sigma_e R_{tool}}}. \qquad \text{Eq. (5)}$$

The accuracy of this approximation is dependent on the relative relation between the metal skin depth $\delta_s$ and the effective radius $r_e$. It works best when $\delta_s \gg r_e$ so that the entire solid pipe cross section has current flow. If only part of the cross section has current flow when $\delta_s$ is smaller than $r_e$, the approximation accuracy of ESO system 200 will degrade.

Therefore, ESO system 200 selects the effective radius $r_e$ by calculating the skin depth $\delta_s$ for the cross-sections of target well structure 100, and then selecting an effective radius smaller than the skin depth. The skin depth may be calculated using:

$$\delta_s = \sqrt{\frac{2}{\pi \sigma_e \mu_0 \mu_r f}}. \qquad \text{Eq. (6)}$$

Since the permeability of target well structure 100 does not affect the effective radius, $\mu_r$ is chosen to be 1 to maximize the metal skin depth of the effective model. Owing to both ranging and EM telemetry application operated at very low frequencies (~10 Hz, e.g.), the corresponding metal skin depth satisfies $\delta_s \gg r_e$ and thereby the approximation method has very good accuracy at such operating frequencies. If a higher frequency is required, the approximation accuracy may degrade, but reasonable results still can be achieved for frequencies ranging up to 100 Hz. Accordingly, the effective model has been generated at block 304.

Figure 7A:
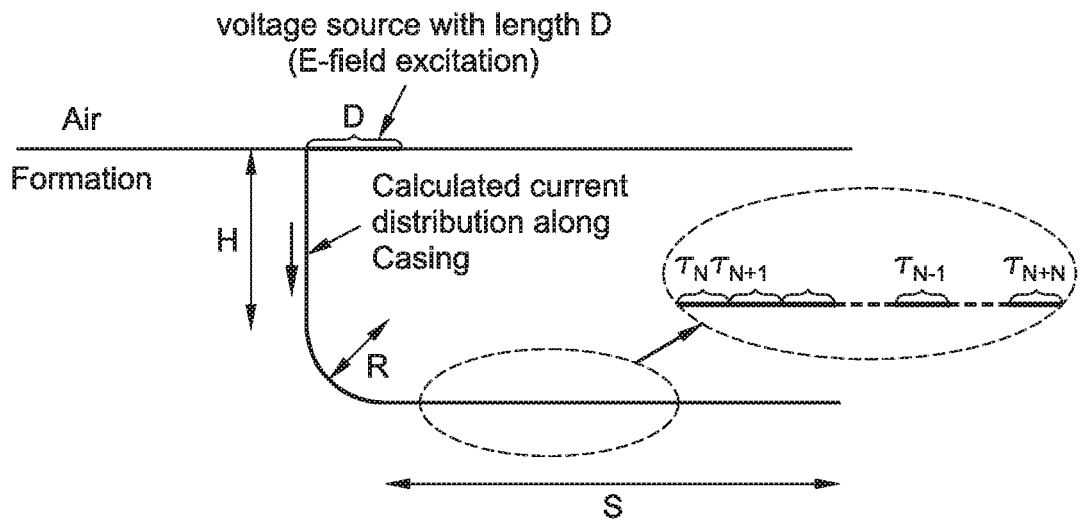
FIGS. 7A and 7B are effective models of source excitation generated in a ranging and EM telemetry application, respectively, according to certain illustrative methods of the present disclosure.

At block 306, ESO system 200 then analyzes the effective model using a FAST Code method to thereby obtain a current/field distribution along the target well structure. In this illustrative method, the effective model is approximated as a thin wire and modeled using 1D MOM Fast Code method. FIG. 7A is an effective model of a surface excitation generated according to certain illustrative methods of the present disclosure. In the MOM method, for example, the effective model is modeled as many sections of dipoles that are embedded in the conducting half space (i.e., formation). An "isolation gap" (having a length "D") with signals applied to the two ends (E-field excitation) is modeled as the transmitter (i.e., excitation source). In FIG. 7A, the voltage source transmitter is placed at a fixed positioned at the surface and connected to the wellhead to model/simulate the surface excitation performance for a magnetic ranging application. The effective model is shown as having a defined vertical section H, build radius R and horizontal section length S. $\Gamma_M$ refers to the M'th element of the discretized model, each of which can have a different length, electrical impedance, and associated current or electromagnetic fields. Therefore, the current distribution along the target well structure casing is calculated by ESO system 200, and down hole current levels can thereby be estimated for ranging with a second drilling well.

Figure 7B:
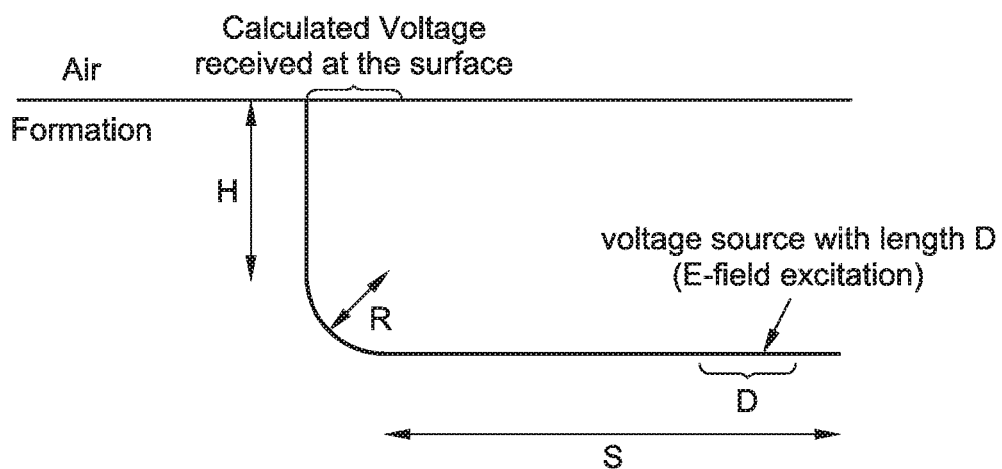

In certain other illustrative methods, the excitation source can also be placed down-hole near the drill bit in order to model an electrode excitation for an EM telemetry system, as illustrated in FIG. 7B. Alternatively, the excitation source may also be positioned at a deviated or bent section of the target well structure. Nevertheless, in this example, ESO system 200 calculates the voltage at the surface, and the resulting predicted signal level may be utilized in assist in system configuration for optimal operation. In certain methods, by using the Green's function for a two-layer medium for dipole radiation in the presence of a conducting half-space, the integral equation for the E-field generated by the effective model can be developed. The integral equation array for E field at all dipole sections can be discretized into a matrix equation and solved using Method of Moments ("MOM"). The current distribution along the drilling pipe or E-field (voltage) at the surface can then be calculated by ESO system 200.

Based upon the current distribution, various signal parameters (e.g., signal strength) may be calculated, and downhole ranging or telemetry operations may be conducted accordingly. In certain methods, one or more parameters of the ranging operation may be adjusted based upon the calculated signal parameters.

In an alternative method of the present disclosure, inhomogeneous pipe profiles along the measured depth ("MD") of the wellbore may also be approximated as the effective model. In practical applications, the target well structure profile along the MD may vary due to different layers of casings and changes in casing materials. Therefore, the illustrative methods described herein are also capable of handle inhomogeneous pipe profiles by modeling it as a solid pipe (i.e., effective model) with varying conductivities along the MD.

Figure 8:
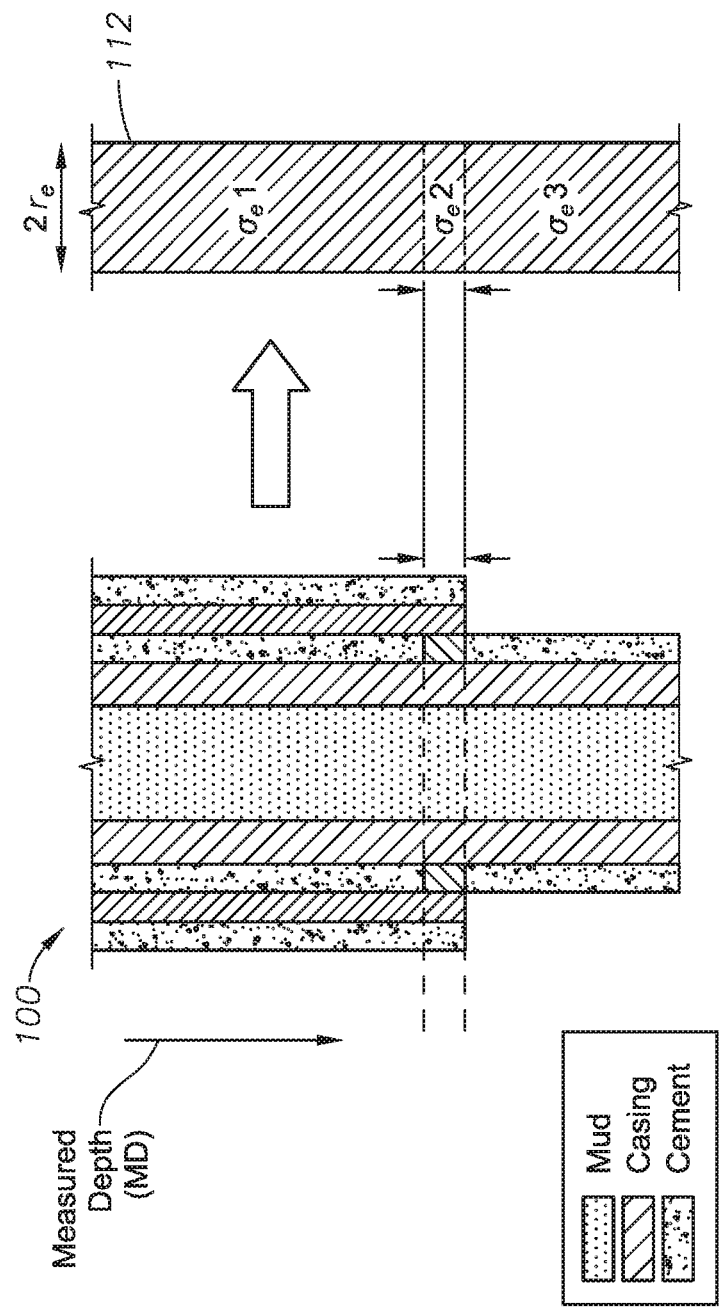
FIG. 8 illustrates the approximation of a complex target well structure with multiple casings into an effective model, according to certain illustrative methods of the present disclosure.

An example with multiple casings is shown in FIG. 8, whereby another target well structure 100 and effective model 112 are illustrated. Here, three different target well structure profile sections are present due to multiple casings and connectors. In order for ESO system 200 to model this pipe, and with reference to FIG. 3, each section i is analyzed with ESO system 200 first to obtain resistance per unit length $R_{tool}$ (i), as previously described at block 302. An arbitrary $\sigma_e$ 1 is then chosen for the first section and the effective radius $r_e$ is calculated at block 304. Keeping the same $r_e$ for other sections, ESO system 200 then calculates $\sigma_e$ (i) for the other sections at block 304. Hence, an effective model with a constant radius and varying conductivities along the MD is obtained.

During an MOM analysis for effective model 112 of FIG. 8, instead of defining a constant conductivity for the pipe, a conductivity array reflecting the varying pipe profiles is defined by ESO system 200. Each discretized pipe element will have one conductivity value. ESO system 200 incorporates the conductivity array into the matrix equation, whereby it is solved using, for example, the MOM method.

Figure 9:
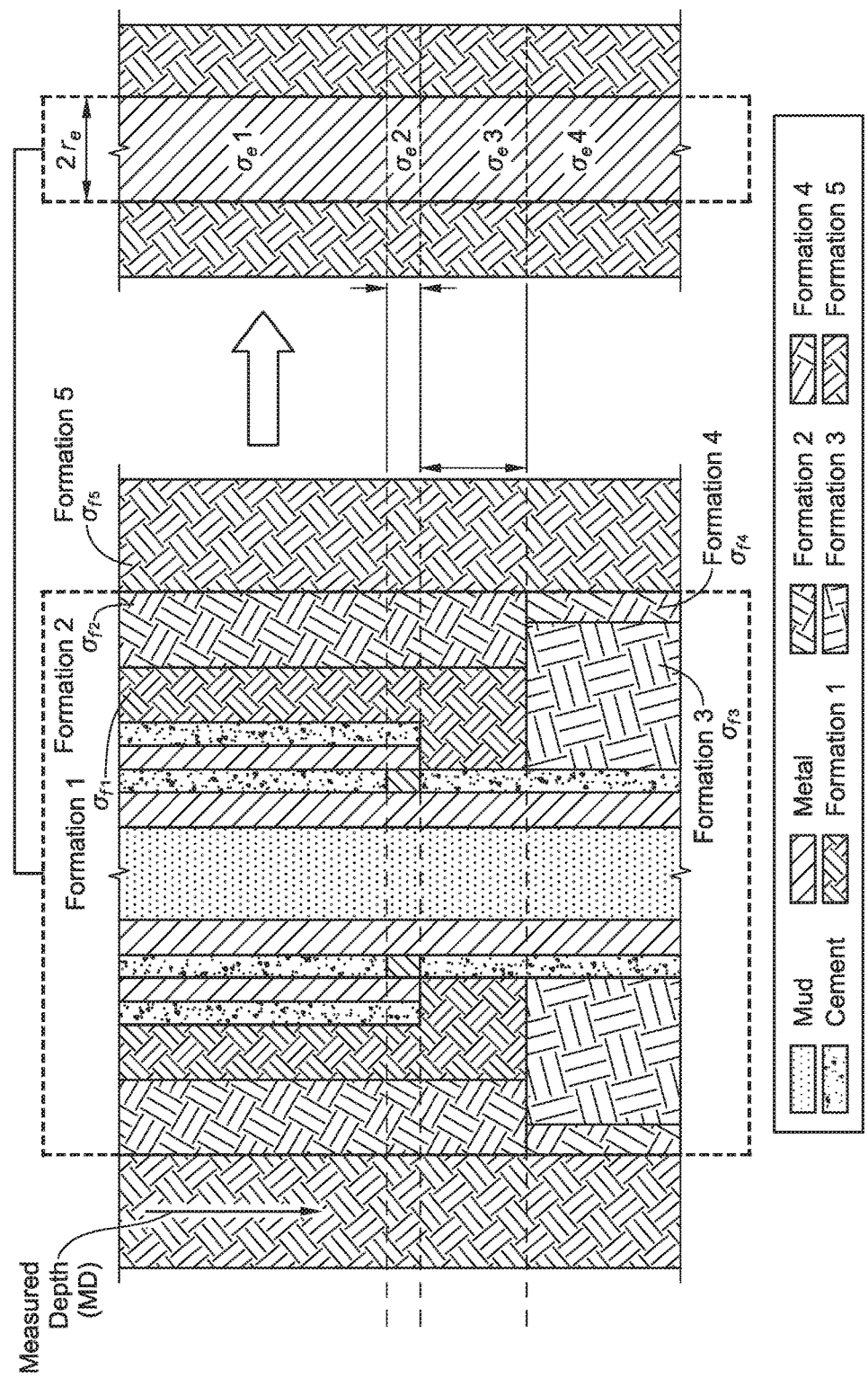
FIG. 9 illustrates the approximation of target well structure having an inhomogeneous formation and pipe into an effective model, according to certain illustrative methods of the present disclosure.

In yet other illustrative methods of the present disclosure, inhomogeneous formation layers with both radial and vertical variations may also be approximated as an effective model. FIG. 9 illustrates the conversion of target well structure having inhomogeneous formation and pipe profiles into an effective model. In such methods, for each vertical layer, radial varying formation zones can be approximated as part of the tool and included into in the effective model. The calculated effective resistance per unit length is then used to derive an equivalent solid cylinder radius (i.e., effective model) in the same way as previously described. For inhomogeneous pipe profiles along the MD (vertical variation), the effective resistance per unit length can be obtained for each vertical layer accordingly as shown in FIG. 9.

By including radial and vertical varying formation zones into the effective model, the original inhomogeneous formation problem is converted into a homogeneous formation problem. As shown, arbitrary formation conductivities $\sigma_{f1, 2, 5}$ are approximated as $\sigma_e$ (i), as previously described. Here, for example, the formation layers may have different resistivities. Hence, the methods of the present disclosure may also be used to solve this form of effective model. No complicated multi-region Green's function is needed in this illustrative method in order to improve the MOM method and to model the inhomogeneous medium.

Figure 10:
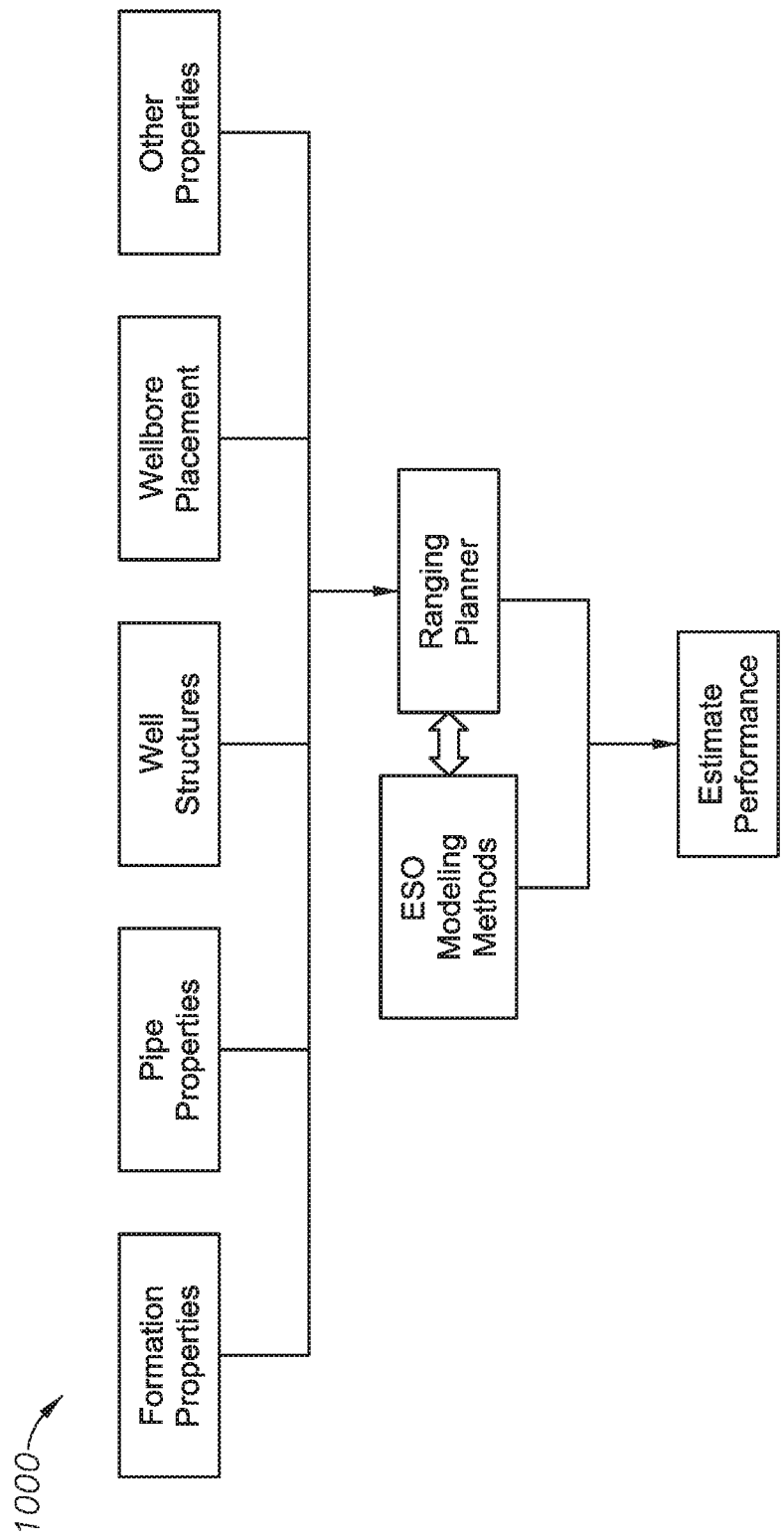
FIGS. 10 and 11 are ranging planner processing flowcharts, according to certain alternative illustrative methods of the present disclosure.

The illustrative methods described herein are able to quickly estimate signal strength on the pipe with detailed well structures and complicated inhomogeneous formation models. As a result, reliable estimation of signal strength can be achieved in real-time to roughly understand surface excitation performance for magnetic ranging or communication performance for EM telemetry. Consequently, the illustrative methods can also be integrated with ranging planner software. FIG. 10 is a ranging planner processing flowchart 1000, according to certain illustrative methods of the present disclosure. In flow chart 1000, excitation source performance can be simulated prior to running a particular field job with inputs of formations profiles/properties (e.g., which can be estimated from resistivity logs of offset wells and/or the target well), pipe properties (e.g., which can be estimated from pipe vendor datasheet), detailed well structures (e.g., including mud, cement, and pipe dimension), wellbore placement, and other properties (such as temperature). All of this data is fed into the ranging planner which iteratively works with ESO system 200 ("ESO modeling methods") to thereby estimate the system performance.

Figure 11:
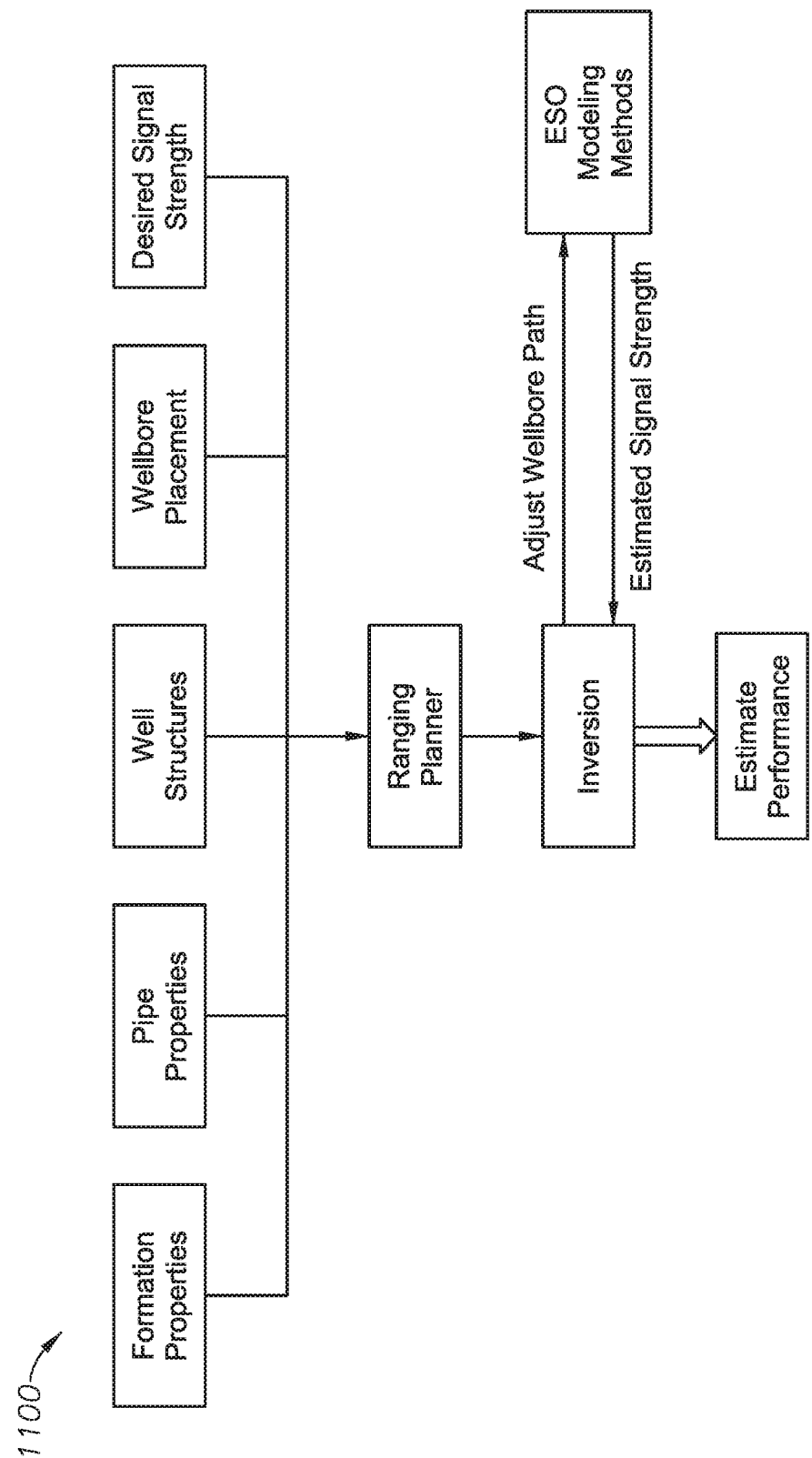
Figure 12:
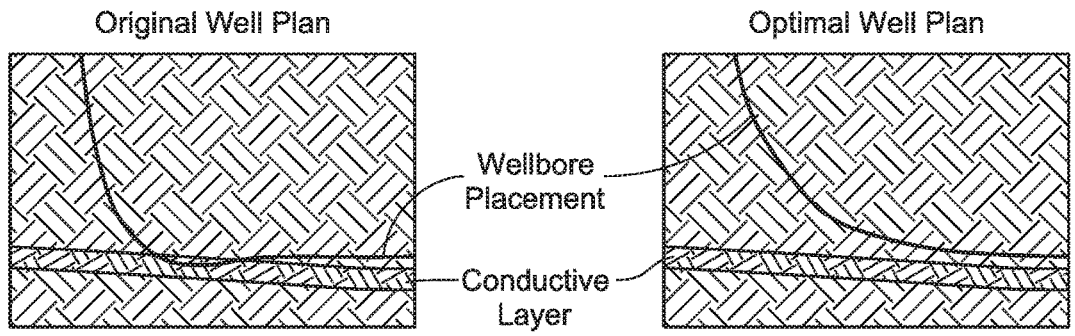
FIG. 12 illustrates a comparison of an original wellbore placement versus a wellbore placement optimized using methods of the present disclosure.

In an alternative method, the illustrative ranging planner is also able to provide optimized well placement to obtain desired signal strength for a particular well before it is drilled and completed. FIG. 11 shows the processing flowchart 1100 for such an application. First, similar data inputs are required, including formation properties, pipe properties, pipe total length, mud and cement resistivities, etc. But the wellbore placement path, wellbore TVD, and wellbore MD will be inverted based upon the desired signal strength. For example, the left-hand side of FIG. 12 could be the original wellbore placement for a particular field job. However, due to conductive formations at certain depths, the signal strength may significant drop if the wellbore penetrate such layers. Consequently, when the ranging planner utilizes the illustrative methods described herein to estimate the signal strength for different drilling paths, an improved well placement is generated in order to meet with the desired signal strength. The right-hand side of FIG. 12 shows the optimized wellbore placement that meets with the desired signal performance, according to methods described herein.

It is noted that such inversion and FAST modeling in the ranging planner can be performed prior and/or during each field job; that is, the ranging planner can be considered a pre-job modeling and/or real-time modeling application. For the real-time modeling, the illustrative methods can be also calibrated based on real-time measurements such that input properties can be better adjusted to match with field measurements and thereby estimate more accurate results thereafter.

Figure 13:
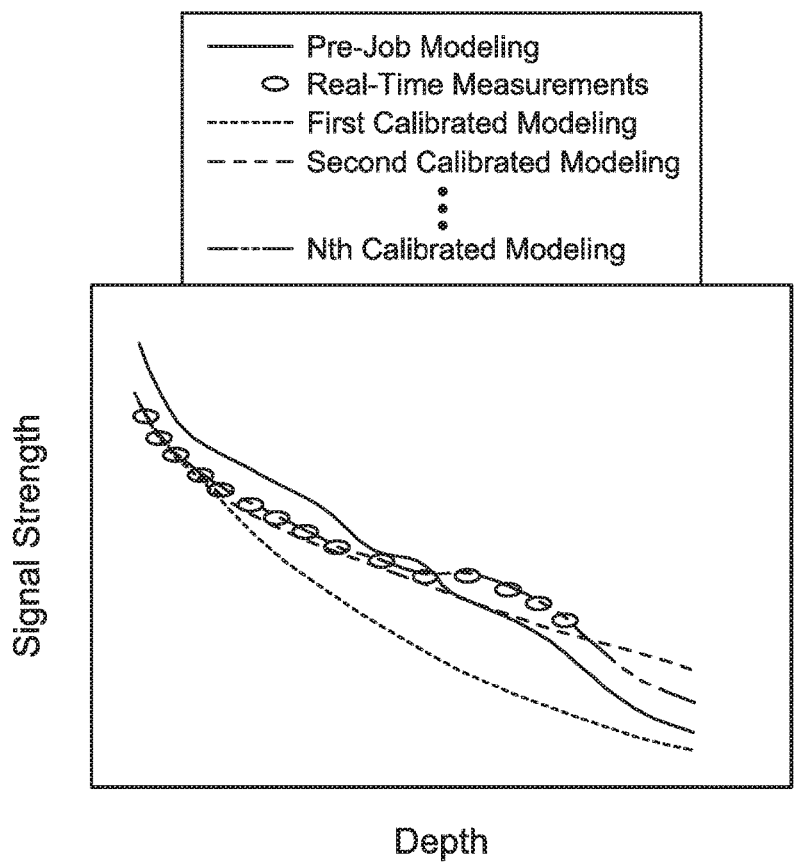
FIG. 13 graphically illustrates original real-time calibration schemes implemented according to the illustrative methods of the present disclosure.

In addition, the illustrative ranging planner simulation can be also calibrated by real-time measurements as shown in FIG. 13 which illustrates alternative real-time calibration schemes, according to certain illustrative methods of the present disclosure. Here, the ranging planner may first run pre-job modeling based on the best knowledge of all said properties (e.g., historical data) and thereby acquire preliminary predictions on signal length as the "Pre-job Modeling" line in FIG. 13. Then, the ranging planner can utilize downhole sensors measurements in real-time (shown as "Real-Time Measurements") to compare with the pre-job modeling. If the best knowledge properties are correct, theoretically the pre-job modeling should match with the measurements. Still, the downhole environment may vary and thereby difference between modeling and measurements may be observed, as shown in FIG. 13. Thus, the ranging planner will re-model the signal strength by adjusting the best knowledge properties within reasonable ranges to match with field measurements. Finally, the ranging planner will predict the signal strength for the rest of the well based upon the twisted properties. This real-time calibration can be performed multiple times using the methods described herein to ensure better estimation on downhole signal strength. Thereafter, the most accurate model may be utilized to drill a wellbore in real-time.

Now that a variety of alternative workflows of the present disclosure have been described, an illustrative logging-while-drilling ("LWD") application will now be described. Alternatively, however, other applications may include, for example, measurement-wile-drilling ("MWD") or wireline applications.

Figure 14:
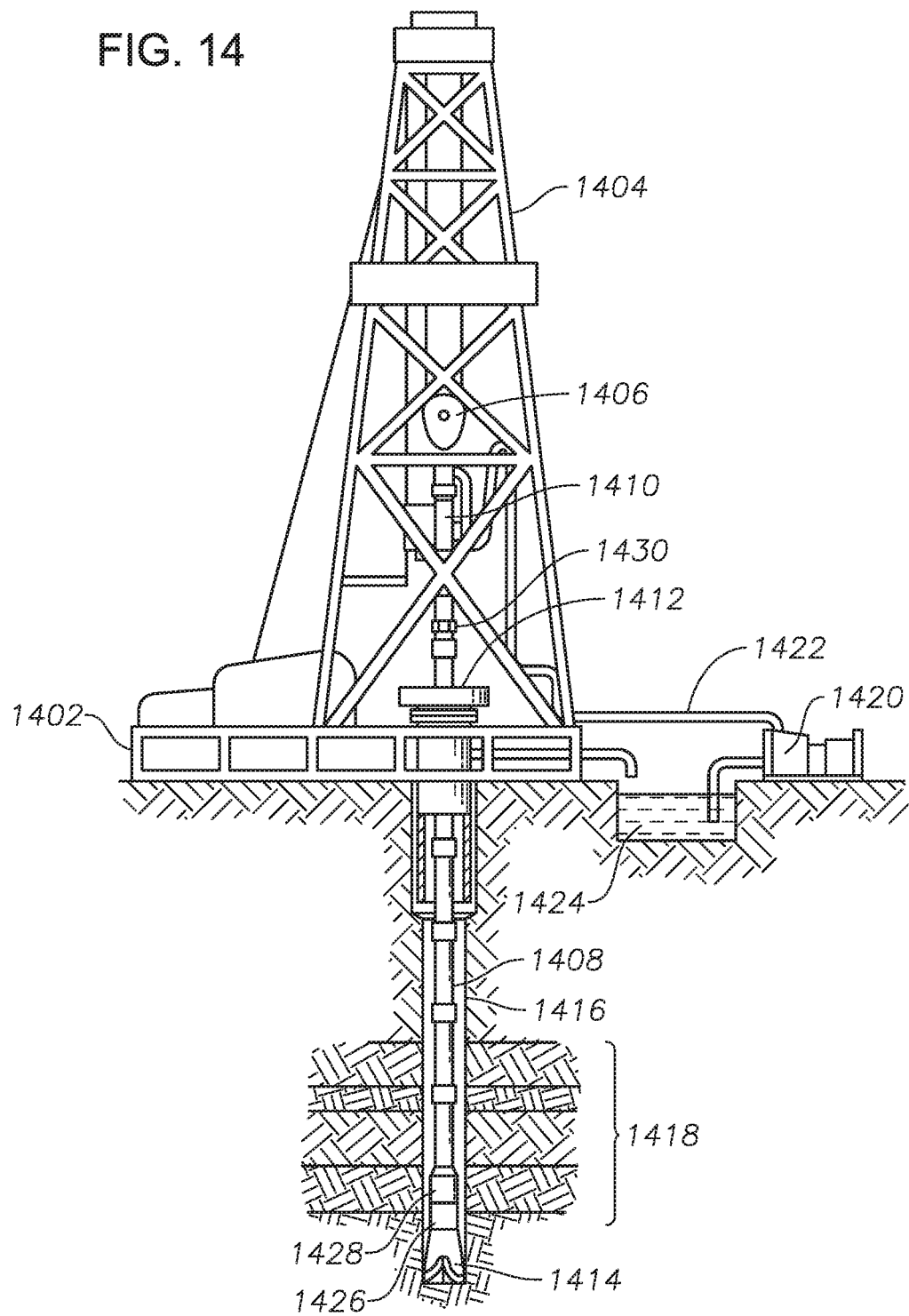
FIG. 14 illustrates a wellbore which was planned and drilled using the illustrative wellbore design and excitation source placement methods described herein.

FIG. 14 illustrates a well system comprising a wellbore being drilled based upon the illustrative wellbore design and excitation optimization methods described herein. FIG. 14 illustrates a drilling platform 1402 equipped with a derrick 1404 that supports a hoist 1406 for raising and lowering a drill string 1408. Hoist 1406 suspends a top drive 1410 suitable for rotating drill string 1408 and lowering it through well head 1412. Connected to the lower end of drill string 1408 is a drill bit 1414. As drill bit 1414 rotates, it creates a wellbore 1416 that passes through various layers of a formation 1418. A pump 1420 circulates drilling fluid through a supply pipe 1422 to top drive 1410, down through the interior of drill string 1408, through orifices in drill bit 1414, back to the surface via the annulus around drill string 1408, and into a retention pit 1424. The drilling fluid transports cuttings from the borehole into pit 1424 and aids in maintaining the integrity of wellbore 1416. Various materials can be used for drilling fluid, including, but not limited to, a salt-water based conductive mud.

A logging tool 1426 is integrated into the bottom-hole assembly near the bit 1414. In this illustrative embodiment, logging tool 1426 is an LWD tool; however, in other illustrative embodiments, logging tool 1426 may be utilized in a wireline or tubing-conveyed logging application.

As drill bit 1414 extends wellbore 1416 through formations 1418, logging tool 1426 collects measurement signals relating to various formation properties, as well as the tool orientation and various other drilling conditions. In certain embodiments, logging tool 1426 may take the form of a drill collar, i.e., a thick-walled tubular that provides weight and rigidity to aid the drilling process. However, as described herein, logging tool 1426 includes an induction or propagation resistivity tool to sense geology and resistivity of formations. A telemetry sub 1428 may be included to transfer images and measurement data/signals to a surface receiver 1430 and to receive commands from the surface. In some embodiments, telemetry sub 1428 does not communicate with the surface, but rather stores logging data for later retrieval at the surface when the logging assembly is recovered.

Still referring to FIG. 14, logging tool 1426 includes a system control center ("SCC"), along with necessary processing/storage/communication circuitry, that is communicably coupled to one or more sensors (not shown) utilized to acquire formation measurement signals reflecting formation parameters. In certain embodiments, once the measurement signals are acquired, the system control center calibrates the measurement signals and communicates the data back uphole and/or to other assembly components via telemetry sub 1428. In an alternate embodiment, the system control center may be located at a remote location away from logging tool 1426, such as the surface or in a different borehole, and performs the processing accordingly.

The logging sensors utilized along logging tool 1426 are resistivity sensors, such as, for example, magnetic or electric sensors, and may communicate in real-time. Illustrative magnetic sensors may include coil windings and solenoid windings that utilize induction phenomenon to sense conductivity of the earth formations. Illustrative electric sensors may include electrodes, linear wire antennas or toroidal antennas that utilize Ohm's law to perform the measurement. In addition, the sensors may be realizations of dipoles with an azimuthal moment direction and directionality, such as tilted coil antennas. In addition, the logging sensors may be adapted to perform logging operations in the up-hole or downhole directions. Telemetry sub 1428 communicates with a remote location (surface, for example) using, for example, acoustic, pressure pulse, or electromagnetic methods. Although not shown in FIG. 14, placement of the excitation source used in conjunction with the telemetry system (for example) was optimized using the method described herein.

In view of the foregoing, the illustrative methods described herein may be used to obtain more reliable performance estimates of the ranging excitation or telemetry performance pre-job. The methods may also be used to make updates on the plan in real-time, which can allow the operator to have heads-up before unexpected situations develop.

Embodiments described herein further relate to any one or more of the following paragraphs:

1. A method to optimize a downhole operation, the method comprising: calculating an effective resistance per unit length of a target well structure that forms part of a well system, the well system comprising an excitation source and a receiver; generating an effective model using the effective resistance per unit length, the effective model comprising an effective radius and effective conductivity; inputting the effective model into a FAST Code to thereby calculate at least one parameter of a signal received by the receiver; and conducting a downhole ranging or telemetry operation based upon the signal parameter.

2. A method as defined in paragraph 1, wherein conducting the downhole ranging operation comprises adjusting a parameter of the ranging operation based upon the signal parameter.

3. A method as defined in paragraphs 1 or 2, wherein the excitation source has a fixed position.

4. A method as defined in any of paragraphs 1-3, wherein the position of the excitation source is at a well-head of the target well structure.

5. A method as defined in any of paragraphs 1-4, wherein the position of the excitation source is in a deviated or horizontal section of the target well structure.

6. A method as defined in any of paragraphs 1-5, wherein the signal parameter is a signal strength.

7. A method as defined in any of paragraphs 1-6, wherein calculating the effective resistance per unit length comprises: discretizing cross-sections of the target well structure into a model; calculating magnetic and electric field values of the discretized model; and utilizing the magnetic and electric field values to determine the effective resistance per unit length for the cross-sections.

8. A method as defined in any of paragraphs 1-7, wherein generating the effective model comprises selecting an effective conductivity and radius for cross-sections of the effective model, wherein the effective model comprises the effective conductivity and effective radius per cross-section.

9. A method as defined in any of paragraphs 1-8, wherein the effective radius is selected by: calculating a skin depth for cross-sections of the target well structure; and selecting a radius smaller than the skin depth.

10. A method as defined in any of paragraphs 1-9, wherein the cross-sections of the target well structure comprise the target well structure and surrounding formation layers.

11. A method as defined in any of paragraphs 1-10, wherein calculating the effective resistance per unit length considers at least one of drilling mud, cement, tubulars, and formation layers present in or near the well system.

12. A method as defined in any of paragraphs 1-11, wherein the target well structure is deviated or bent.

13. A method as defined in any of paragraphs 1-12, wherein a formation in which the target well structure is positioned comprises at least two layers with different resistivities.

14. A method as defined in any of paragraphs 1-13, wherein an excitation performance of the excitation source is simulated using the effective model.

15. A method as defined in any of paragraphs 1-14, wherein placement of a wellbore is determined using the excitation performance.

16. A method as defined in any of paragraphs 1-15, wherein the effective model is used to optimize drilling of a wellbore in real-time.

17. A method as defined in any of paragraphs 1-16, wherein calculating the signal parameter comprises using a current distribution along the target well structure to calculate the signal parameter.

18. A method as defined in any of paragraphs 1-17, wherein drilling the wellbore in real-time comprises: performing pre-job modeling of the current distribution using historical downhole data; performing real-time modeling of the current distribution using real-time downhole data; comparing the pre-job and real-time models to determine the most accurate model; and utilizing the most accurate model to drill the wellbore.

19. A downhole well system, comprising: a bottomhole assembly extending along a wellbore; an excitation source that generates a signal; a receiver for receiving the signal; and processing circuitry that determines placement for the excitation source within the well system using a method comprising: calculating an effective resistance per unit length of the wellbore; generating an effective model using the effective resistance per unit length, the effective model comprising an effective radius and effective conductivity; and inputting the effective model into a FAST Code to thereby calculate at least one parameter of the signal received by the receiver.

20. A well system as defined in paragraph 19, wherein the processing circuitry adjusts a parameter of the well system based upon the signal parameter.

21. A well system as defined in paragraphs 19 or 20, wherein the excitation source has a fixed position.

22. A well system as defined in any of paragraphs 19-21, wherein the position of the excitation source is at a wellhead of the wellbore.

23. A well system as defined in any of paragraphs 19-22, wherein the position of the excitation source is in a deviated or horizontal section of the wellbore.

24. A well system as defined in any of paragraphs 19-23, wherein the signal parameter is a signal strength.

25. A well system as defined in any of paragraphs 19-24, wherein calculating the effective resistance per unit length comprises discretizing cross-sections of the wellbore into a model; calculating magnetic and electric field values of the discretized model; and utilizing the magnetic and electric field values to determine the effective resistance per unit length for the cross-sections.

26. A well system as defined in any of paragraphs 19-25, wherein generating the effective model comprises selecting an effective conductivity and radius for cross-sections of the effective model, wherein the effective model comprises the effective conductivity and effective radius per cross-section.

27. A well system as defined in any of paragraphs 19-26, wherein the effective radius is selected by: calculating a skin depth for cross-sections of the wellbore; and selecting a radius smaller than the skin depth.

28. A well system as defined in any of paragraphs 19-27, wherein the cross-sections of the wellbore comprise the wellbore and surrounding formation layers.

29. A well system as defined in any of paragraphs 19-28, wherein calculating the effective resistance per unit length considers at least one of drilling mud, cement, tubulars, and formation layers present in or near the well system.

30. A well system as defined in any of paragraphs 19-29, wherein the wellbore is deviated or bent.

31. A well system as defined in any of paragraphs 19-30, wherein a formation in which the wellbore is positioned comprises at least two layers with different resistivities.

32. A well system as defined in any of paragraphs 19-31, wherein an excitation performance of the excitation source is simulated using the effective model.

33. A well system as defined in any of paragraphs 19-32, wherein placement of the wellbore is determined using the excitation performance.

34. A well system as defined in any of paragraphs 19-33, wherein the effective model is used to optimize drilling of the wellbore in real-time.

35. A well system as defined in any of paragraphs 19-34, wherein calculating the signal parameter comprises using a current distribution along the wellbore to calculate the signal parameter.

36. A well system as defined in any of paragraphs 19-35, wherein drilling the wellbore in real-time comprises: performing pre-job modeling of the current distribution using historical downhole data; performing real-time modeling of the current distribution using real-time downhole data; comparing the pre-job and real-time models to determine the most accurate model; and utilizing the most accurate model to drill the wellbore.

Moreover, the methods described herein may be embodied within a system comprising processing circuitry to implement any of the methods, or a in a computer-program product comprising instructions which, when executed by at least one processor, causes the processor to perform any of the methods described herein.

Although various embodiments and methodologies have been shown and described, the disclosure is not limited to such embodiments and methodologies and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A method to optimize a downhole operation, the method comprising:
calculating, using an excitation source optimization ("ESO") system having processing circuitry therein, an effective resistance per unit length of a target well structure that forms part of a well system, the well system comprising an excitation source and a receiver, wherein the target well structure is located in a formation;
generating, using the ESO system, an effective model using the effective resistance per unit length, the effective model comprising an effective radius and effective conductivity;
inputting, using the ESO system, the effective model into a FAST Code to thereby calculate at least one parameter of a signal received by the receiver;
drilling a second wellbore in the formation with a drilling tool;
conducting a downhole ranging or telemetry operation based upon the signal parameter; and
adjusting drilling of the second wellbore based on the signal parameter.

2. A method as defined in claim 1, wherein conducting the downhole ranging operation comprises adjusting a parameter of the ranging operation based upon the signal parameter.

3. A method as defined in claim 1, wherein the excitation source has a fixed position.

4. A method as defined in claim 3, wherein the position of the excitation source is at a well-head of the target well structure.

5. A method as defined in claim 3, wherein the position of the excitation source is in a deviated or horizontal section of the target well structure.

6. A method as defined in claim 1, wherein the signal parameter is a signal strength.

7. A method as defined in claim 1, wherein calculating the effective resistance per unit length comprises:
   discretizing cross-sections of the target well structure into a model;
   calculating magnetic and electric field values of the discretized model; and
   utilizing the magnetic and electric field values to determine the effective resistance per unit length for the cross-sections.

8. A method as defined in claim 7, wherein the cross-sections of the target well structure comprise the target well structure and surrounding formation layers.

9. A method as defined in claim 1, wherein generating the effective model comprises selecting an effective conductivity and radius for cross-sections of the effective model, wherein the effective model comprises the effective conductivity and effective radius per cross-section.

10. A method as defined in claim 9, wherein the effective radius is selected by:
    calculating a skin depth for cross-sections of the target well structure; and
    selecting a radius smaller than the skin depth.

11. A method as defined in claim 1, wherein calculating the effective resistance per unit length considers at least one of drilling mud, cement, tubulars, and formation layers present in or near the target well structure.

12. A method as defined in claim 1, wherein the target well structure is deviated or bent.

13. A method as defined in claim 1, wherein the formation in which the target well structure is positioned comprises at least two layers with different resistivities.

14. A method as defined in claim 1, wherein an excitation performance of the excitation source is simulated using the effective model.

15. A method as defined in claim 14, wherein placement of the second wellbore is determined using the excitation performance.

16. A method as defined in claim 15, wherein the effective model is used to optimize drilling of the second wellbore in real-time.

17. A method as defined in claim 16, wherein drilling the second wellbore in real-time comprises:
    performing pre-job modeling of a current well plan using historical downhole data;
    calibrating pre-job modeling results of the current well plan using real-time downhole data;
    improving the well plan and repeating the pre-job modeling and the calibration until a desired signal strength estimation is achieved, thereby determining the most accurate model; and
    utilizing the most accurate model to drill the second wellbore.

18. A method as defined in claim 1, wherein calculating the signal parameter comprises using a current distribution along the target well structure to calculate the signal parameter.

19. A non-transitory computer program product comprising instructions which, when executed by at least one processor, causes the processor to perform the method of claim 1.

20. A downhole well system, comprising:
    a bottom hole assembly extending along a target wellbore in a formation;
    an excitation source at the target wellbore that generates a signal;
    a receiver at the target wellbore for receiving the signal; and
    processing circuitry that determines placement for the excitation source at the target wellbore using a method comprising:
       calculating an effective resistance per unit length of the target wellbore;
       generating an effective model using the effective resistance per unit length, the effective model comprising an effective radius and effective conductivity; and
       inputting the effective model into a FAST Code to thereby calculate at least one parameter of the signal received by the receiver; and
    a drilling tool for drilling a second wellbore in the formation, wherein the second wellbore is drilled based on the at least one parameter.

21. A well system as defined in claim 20, wherein the processing circuitry adjusts a parameter of the well system based upon the signal parameter.

22. A well system as defined in claim 20, wherein the excitation source has a fixed position.

23. A well system as defined in claim 22, wherein the position of the excitation source is at a well-head of the target wellbore.

24. A well system as defined in claim 22, wherein the position of the excitation source is in a deviated or horizontal section of the target wellbore.

25. A well system as defined in claim 20, wherein the signal parameter is a signal strength.

26. A well system as defined in claim 20, wherein calculating the effective resistance per unit length comprises:
    discretizing cross-sections of the target wellbore into a model;
    calculating magnetic and electric field values of the discretized model; and
    utilizing the magnetic and electric field values to determine the effective resistance per unit length for the cross-sections.

27. A well system as defined in claim 26, wherein the cross-sections of the target wellbore comprise the target wellbore and surrounding formation layers.

28. A well system as defined in claim 20, wherein generating the effective model comprises selecting an effective conductivity and radius for cross-sections of the effective model, wherein the effective model comprises the effective conductivity and effective radius per cross-section.

29. A well system as defined in claim 28, wherein the effective radius is selected by:
    calculating a skin depth for cross-sections of the target wellbore; and
    selecting a radius smaller than the skin depth.

30. A well system as defined in claim 20, wherein calculating the effective resistance per unit length considers at least one of drilling mud, cement, tubulars, and formation layers present in or near the target wellbore.

31. A well system as defined in claim 20, wherein the target wellbore is deviated or bent.

32. A well system as defined in claim 20, wherein the formation in which the wellbore is positioned comprises at least two layers with different resistivities.

33. A well system as defined in claim 20, wherein an excitation performance of the excitation source is simulated using the effective model.

34. A well system as defined in claim 33, wherein placement of the second wellbore is determined using the excitation performance.

35. A well system as defined in claim 34, wherein the effective model is used to optimize drilling of the second wellbore in real-time.

36. A well system as defined in claim 20, wherein calculating the signal parameter comprises using a current distribution along the target wellbore to calculate the signal parameter.

37. A well system as defined in claim 35, wherein drilling the second wellbore in real-time comprises:
- performing pre-job modeling of a current well plan using historical downhole data;
- calibrating pre-job modeling results of the current well plan using real-time downhole data;
- improving the well plan and repeating the pre-job modeling and the calibration until a desired signal strength estimation is achieved, thereby determining the most accurate model; and
- utilizing the most accurate model to drill the second wellbore.

* * * * *